(12) United States Patent
Puchner et al.

(10) Patent No.: US 6,342,429 B1
(45) Date of Patent: Jan. 29, 2002

(54) METHOD OF FABRICATING AN INDIUM FIELD IMPLANT FOR PUNCHTHROUGH PROTECTION IN SEMICONDUCTOR DEVICES

(75) Inventors: Helmut Puchner, Santa Clara, CA (US); Shih-Fen Huang, Wappingers Falls, NY (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/469,579

(22) Filed: Dec. 22, 1999

(51) Int. Cl.[7] ............................................. H01L 21/76
(52) U.S. Cl. ................................. 438/424; 438/303
(58) Field of Search .................... 438/424, 585–589, 438/593, 289, 300–303, 428

(56) References Cited

U.S. PATENT DOCUMENTS 6,143,635 A * 11/2000 Boyd et al. ................ 438/585
6,162,688 A * 12/2000 Gardner et al. ............ 438/289

OTHER PUBLICATIONS

Kizilyalli, N+ Polysilicon Gate PMOSFET's with Indium Doped Buried–Channels, IEEE, vol. 17, No. 2, Feb. 1996, 0741–310696–1996. IEEE.*

* cited by examiner

Primary Examiner—David Nelms
Assistant Examiner—Dung A Le
(74) Attorney, Agent, or Firm—Beyer, Weaver, Thomas & Nguyen, LLP

(57) ABSTRACT

Provided is a technique for forming an indium field implant at the bottom of an STI trench to strengthen the p-well under field oxide, but to not weaken the n-well under the field oxide. The diffusivity of indium is an order of magnitude smaller than that of boron and the activation level of indium is high enough for well dopings. Thus, the implanted indium is able to keep the concentration of p-dopant at the p-n well junction under the field isolation and the oxide/silicon interface high, even with boron depletion, so that punchthrough is avoided.

14 Claims, 3 Drawing Sheets

US 6,342,429 B1

METHOD OF FABRICATING AN INDIUM FIELD IMPLANT FOR PUNCHTHROUGH PROTECTION IN SEMICONDUCTOR DEVICES

FIELD OF INVENTION

The present invention relates to isolation structures in semiconductor device. More particularly, the invention relates to indium implants in shallow trench isolation structures to improve punchthrough protection in semiconductor devices.

BACKGROUND OF THE INVENTION

As transistor active areas and isolation structures shrink, field isolation structures also need to be miniaturized. To isolate the active transistor areas different isolation techniques are employed to avoid electrical current and malfunctioning of the device. The most important isolation techniques are LOCOS (Local Oxidation of Silicon) and STI (Shallow Trench Isolation). For deep-submicron technologies STI is more favorable because of less space consumption due to less lateral encroachment. This allows an increase in integration density and decrease in device spacing. However, not only the isolation structure itself has to be minimized, also the wells where the devices will be placed have to be adapted with regard to field-punchthrough and latch-up immunity.

A conventional shallow trench isolation typically involves depositing an oxide layer on the surface of a semiconductor substrate, followed by deposition or formation of a nitride layer that is patterned to act as a mask for shallow trench etch. The nitride mask also has a role as a proper in-situ control layer for CMP, and preventing further oxidation of the substrate surface where it is masked. The next step involves etching of the shallow trench followed by formation of an oxide liner in the shallow trench. Following formation of the oxide liner, the trench is filled with deposited oxide, and the partly formed device is subjected to CMP to planarize down to the top of the trench and to the substrate layer adjacent to the trench. Next, the p- and n-wells are implanted using n-well and p-well masks on the corresponding sides.

The most commonly used dopant species for p- and n-wells are boron and phosphorus, respectively. The p-well and n-well dopings form a p-n junction under the field oxide of adjacent n+ and p+ diffusion regions. It is important for the device operation that these two diffusion regions (devices) are clearly electrically separated. However, boron tends to diffuse out from the p-well into the substrate, towards the shallow trench and segregate into its oxide. This situation is illustrated in FIG. 1 which depicts a plot 100 of the dopant profile in a cross-section of the silicon substrate underneath the field isolation and in the field isolation above the substrate for a typical CMOS device. Curve 102 represents the doping conditions within a typical p-well underneath the isolation, whereas curve 106 represents a typical n-well doping underneath the isolation displayed as vertical cross-section in a non-compensated well scheme. Both curves 102 and 106 represent the doping conditions in a compensated n-well. As boron 102 tends to deplete at the field isolation/silicon interface 104, phosphorus 106 tends to pile-up. Therefore the p-doping is weaker under the oxide and prone to field-punchthrough in a p-well region.

In older technologies, it was possible to perform a boron field implant prior to field oxidation to strengthen the p-doping directly under the field oxide. However, due to decreasing device and isolation dimensions, such boron doping would diffuse and contribute to the narrow-width channel doping and increase the threshold voltage for narrow-width n-channel devices.

Thus, what is needed is a technique for achieving better field-punchthrough protection in STI devices.

SUMMARY OF THE INVENTION

To achieve the foregoing, the present invention provides a technique for forming an indium field implant at the bottom of an STI trench to strengthen the p-well under field oxide, but to not weaken the n-well under the field oxide. The diffusivity of indium is about an order of magnitude smaller than that of boron and the activation level of indium is high enough for well doping levels. Thus, the implanted indium is able to keep the concentration of p-dopant at the lateral p-n well junction and the oxide/silicon interface high, even with boron depletion, so that punchthrough is avoided.

In one aspect, the invention provides a process for forming a shallow trench isolation in a semiconductor device. The process involves depositing a pad oxide layer on the surface of a silicon substrate, forming a shallow trench in the substrate, forming an oxide liner in the shallow trench thereby creating a silicon/oxide interface in the trench, implanting indium into the trench, and filling the trench with oxide.

In another aspect, the invention provides a semiconductor device. The device includes a pad oxide layer on the surface of a silicon substrate, a shallow trench in the substrate separating two or more device regions, the trench having sidewalls and a bottom, oxide filling the trench and forming a shallow trench isolation having an interface with the silicon substrate, and an indium implant region adjacent to the bottom of the shallow trench isolation.

These and other features and advantages of the present invention are described below with reference to the drawings.

DETAILED DESCRIPTION OF PREFERRED EMBODIMENTS

Reference will now be made in detail to a preferred embodiment of the invention. Examples of the preferred embodiment are illustrated in the accompanying drawings. While the invention will be described in conjunction with this preferred embodiment, it will be understood that it is not intended to limit the invention to such preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a technique for forming an indium field implant at the bottom of an STI trench to strengthen the p-well under field oxide, but to not weaken the n-well under the field oxide. The diffusivity of indium is an order of magnitude smaller than that of boron and the activation level of indium is high enough for well dopings. Thus, the implanted indium is able to keep the concentration of p-dopant at the p-n well junction and the oxide/silicon interface high, even with boron depletion, so that punchthrough is avoided.

Figure 2A:
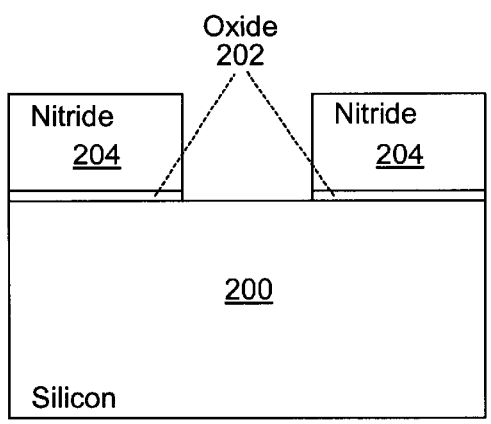
FIGS. 2A–2F depict stages in the fabrication of a semiconductor device having an Indium-implanted shallow trench isolation in accordance with one embodiment of the present invention.

In a preferred embodiment, the process and structure of the present invention are implemented in CMOS (Complimentary Metal Oxide Semiconductor) technology, where complementary transistors (NMOS and PMOS) are fabricated adjacent to each other and separated by the STI trench isolation structure. FIGS. 2A–2F depict stages in the fabrication of a semiconductor device having a indiumized shallow trench isolation and gate oxide in accordance with one embodiment of the present invention. The fabrication process begins, as shown in FIG. 2A, with the formation of a thin pad oxide 202 layer on top of a silicon substrate 200 of a wafer 201. The pad oxide 202 may be formed, for example, by thermal processing or in other ways well known to those of skill in the art, and may have a thickness of about 50 to 400 Å.

Figure 2B:
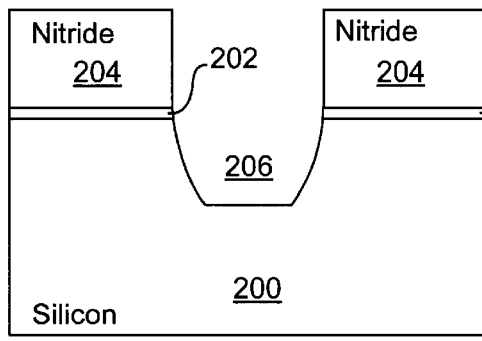
Figure 2C:
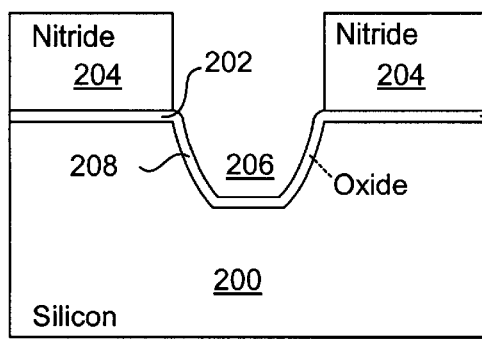
Figure 2D:
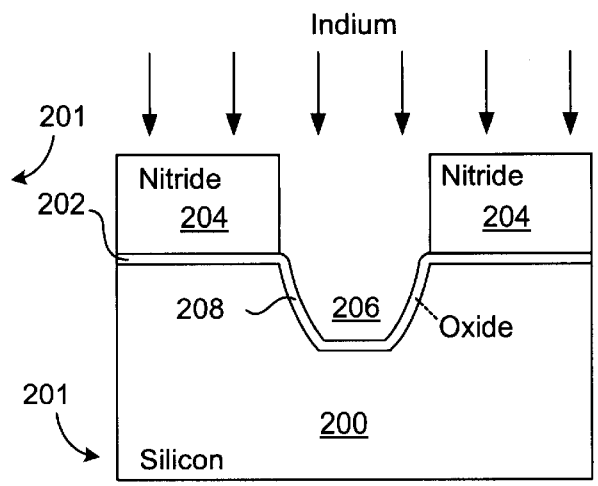

Formation of the pad oxide 202 is followed by a nitride deposition to form a nitride layer 204. The nitride layer 204 is then patterned to form a hard mask, and a trench 206 is etched into the silicon substrate 200 at the open area of the hard mask 204, as shown in FIG. 2B. The trench may be, for example about 0.05 to 0.5 μm, more preferably 0.2 to 0.4 μm deep. Formation of the trench 206 is followed by a liner oxidation of the trench sidewalls to form an oxide liner 208. The nitride deposition, patterning to form the hard mask, trench etch, and liner oxidation may all be formed according to techniques well known to those of skill in the art. For example, the nitride deposition may be done by using a LPCVD (low pressure chemical vapor deposition) process which results in deposition of about 10,000 to 300 Å, preferably about 1600 Å, of nitride 204 on top of the pad oxide layer 202. The STI trench 306 may be etched by using a high density plasma etch tool based-on $HBr,O_2$, or Cl chemistry. The trench depth may range from about 0.05 to 0.5 μm and be aligned to the electrical Source/Drain junction depth. In a typical embodiment the trench depth may be about 3000 Å. The oxide liner 208 may be grown under oxygen in a vertical furnace. The oxide thickness may vary from about 50 to 500 Å depending on the threshold voltage dependence of the width of the device. In a typical embodiment the liner 208 thickness may be about 100 Å.

An indium implant is then performed at the bottom of the trench 206. In one preferred embodiment, shown in FIG. 2D, this indium implant is conducted using single or multiply charged indium ions and an implant energy of about 100 keV–400 keV, preferably about 150 keV, with a dose not to exceed the local n-well doping under the field oxide, but higher than the p-well doping in order to improve punchthrough. In one embodiment the n-well dose may be about 9e12 $cm^{-2}$ at about 320 keV and the p-well dose may be about 7e12 $cm^{-2}$ for non-compensated wells, and about 1.6e13 $cm^{-2}$ and about 7e12 $cm^{-2}$ for compensated wells, respectively. A preferred indium implant condition for both cases (compensated and non-compensated wells) may use 150 keV implant energy and 2.5e12 $cm^{-2}$ implantation dose.

It should be noted that in this embodiment, indium is implanted on both sides of what will subsequently become the p-n well junction, to be substantially centered under the STI. The projected range of this implant should preferably exceed the oxide liner thickness to achieve peak indium dopant concentration near the silicon/oxide linear interface. In this way, since indium is a p-dopant that does not tend to diffuse and segregate as strongly as boron does, p-dopant concentration may be maintained at the p-n well junction and the isolation oxide/p-well silicon interface of the completed device. Thus, as explained further below, a good isolation is maintained between the CMOS devices and punchthrough is avoided.

Figure 2E:
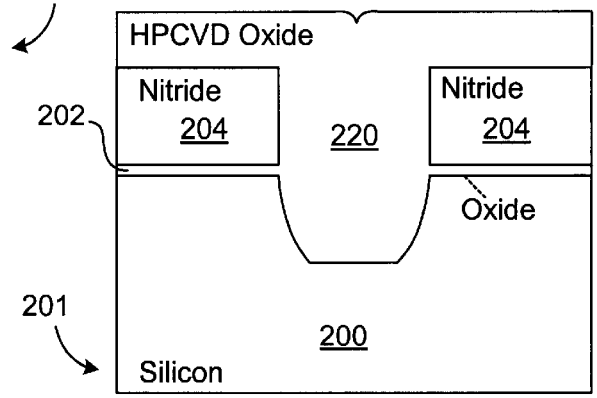

Then, as shown in FIG. 2E, the trench is filled with oxide 220, for example, according to an HDP-CVD or APCVD oxide process known to those of skill in the art. For example, a HDP-CVD process may be employed to deposit about 7500 Å of oxide to completely fill the trench prior to the CMP (chemical mechanical polishing) process. Following oxide deposition, excess oxide and the nitride hard mask 204 are removed down to the substrate 200 level. This removal may be conducted, for example, by a CMP planarization down to the nitride layer which may subsequently be removed by hot phosphoric acid, according to procedures well known in the art.

Figure 2F:
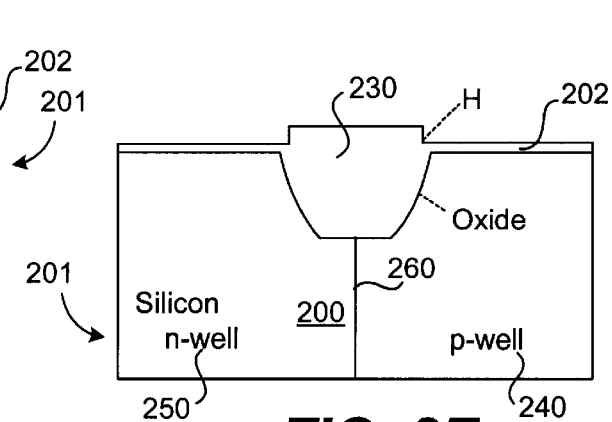

As shown in FIG. 2F, the remaining oxide forms the STI structure 230. The distance, H, is determined by the dishing behavior of the CMP process and is preferably selected and optimized to ensure sufficient field oxide thickness for large island areas. In one embodiment this oxide step height is chosen to protect the isolation corner regions from being overetched during subsequent cleaning steps.

Following planarization and etching, p-well and n-well doping is introduced into the silicon substrate 200. This doping may be conducted according to procedures well known to those of skill in the art, and may be used to form compensated or non-compensated wells. For example, in a compensated well scheme, wells may be formed by masking off the n-channel (p-well) region 240 and implanting the n-well dopant, such as phosphorus, into the p-channel (n-well) region 250 followed by a blanket (unmasked) p-well implant (such as with the dopant boron). The resulting dopant profiles in the n-channel (p-well) region 240 shows a single p-well doping whereas the p-channel (n-well) region 250 exhibits a n-well doping which compensates the p-well implant.

To achieve compensation of the well implants, the doses and energies are chosen accordingly. In particular, the doping of the n-well is conducted such that the concentration of the n-dopant (e.g., phosphorus) is sufficient to overcome the p-dopants present to form a strong n-well. Appropriate doping conditions may be readily determined with little experimentation by one of ordinary skill in the art given the desired performance parameters of the device being fabricated. For example, in one embodiment the phosphorus n-well implantation parameter may be 320 keV energy and 1.6e13 $cm^{-2}$ dose, and the boron p-well implantation parameter may be 120 keV energy and 7e12 cm$^{-2}$ dose. In this way, the compensated n-well is not unduly weakened by the presence of the counter indium and boron p-dopants, while the p-well is strengthened by the addition of the relatively fixed indium implant.

In another embodiment of this invention, both well implants may be masked to create non-compensated wells. For example, doping may be conducted by masking off the n-channel (p-well) region 240 and implanting the n-well dopant, such as phosphorus, into the p-channel (n-well) region 250 followed by a masked p-well implant (such as with the dopant boron). The resulting dopant profiles show an n-channel (p-well) region 240 with a single p-well doping, and a p-channel (n-well) region 250 with a single n-well doping. In this way, the non-compensated n-well is not unduly weakened by the presence of the counter indium p-dopants, while the p-well is strengthened by the addition of the relatively fixed indium implant.

At this stage, standard processing techniques may be used to complete semiconductor devices, for example, processing to form gate oxide layers and polysilicon gates. The processing described above allows for the STIs in CMOS devices, for example, which are resistant to punchthrough.

Figure 1:
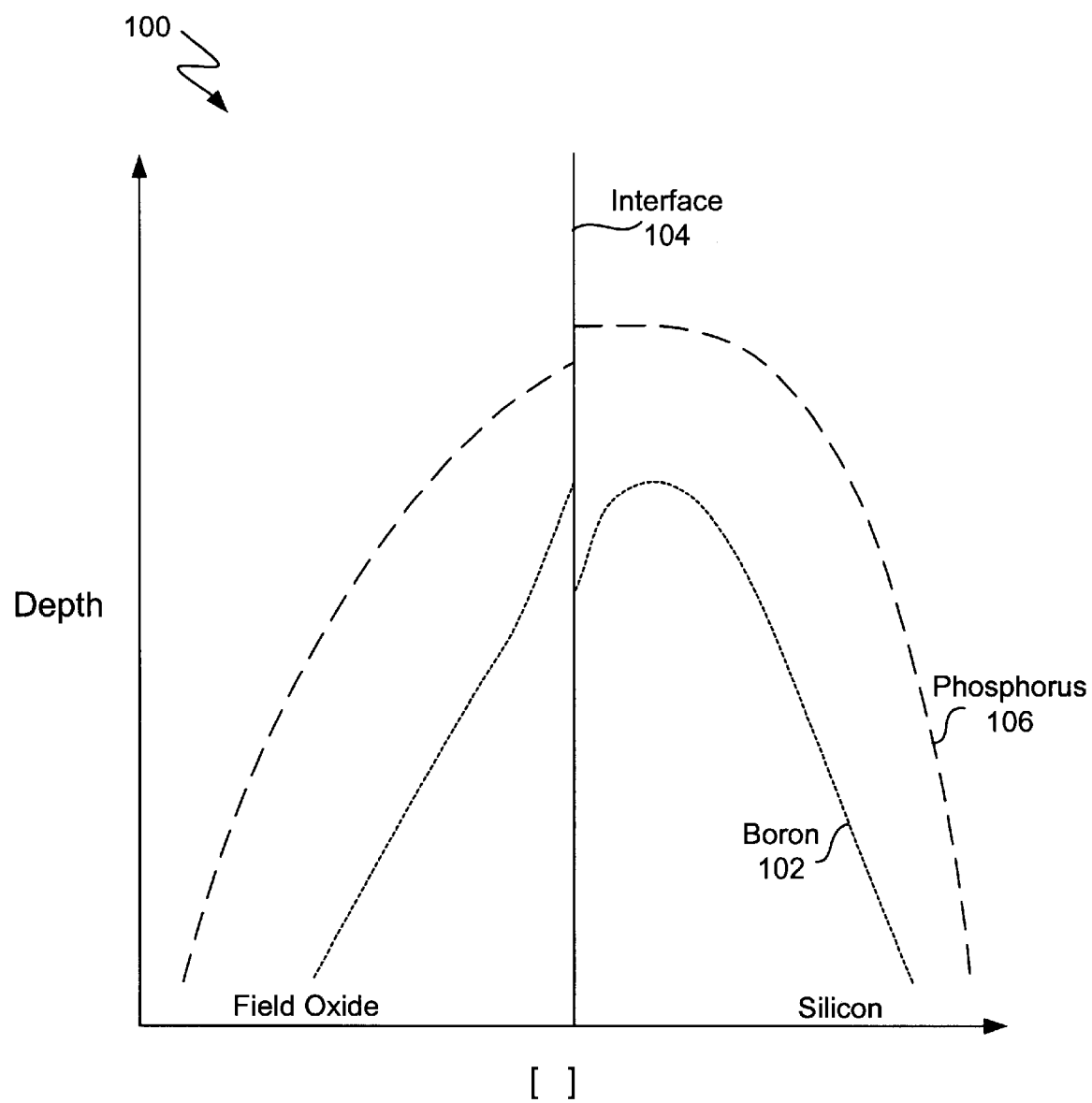
FIG. 1 depicts a graph showing the dopant profile (depth vs. dopant concentration) for cross-sections below and through the field isolation of a CMOS semiconductor device. Represented are the profiles for the n-well (curve 106) and p-well (curve 102) for a device with non-compensated wells, and the n-well (curve 102 and 106) for as device with compensated wells.
Figure 3:
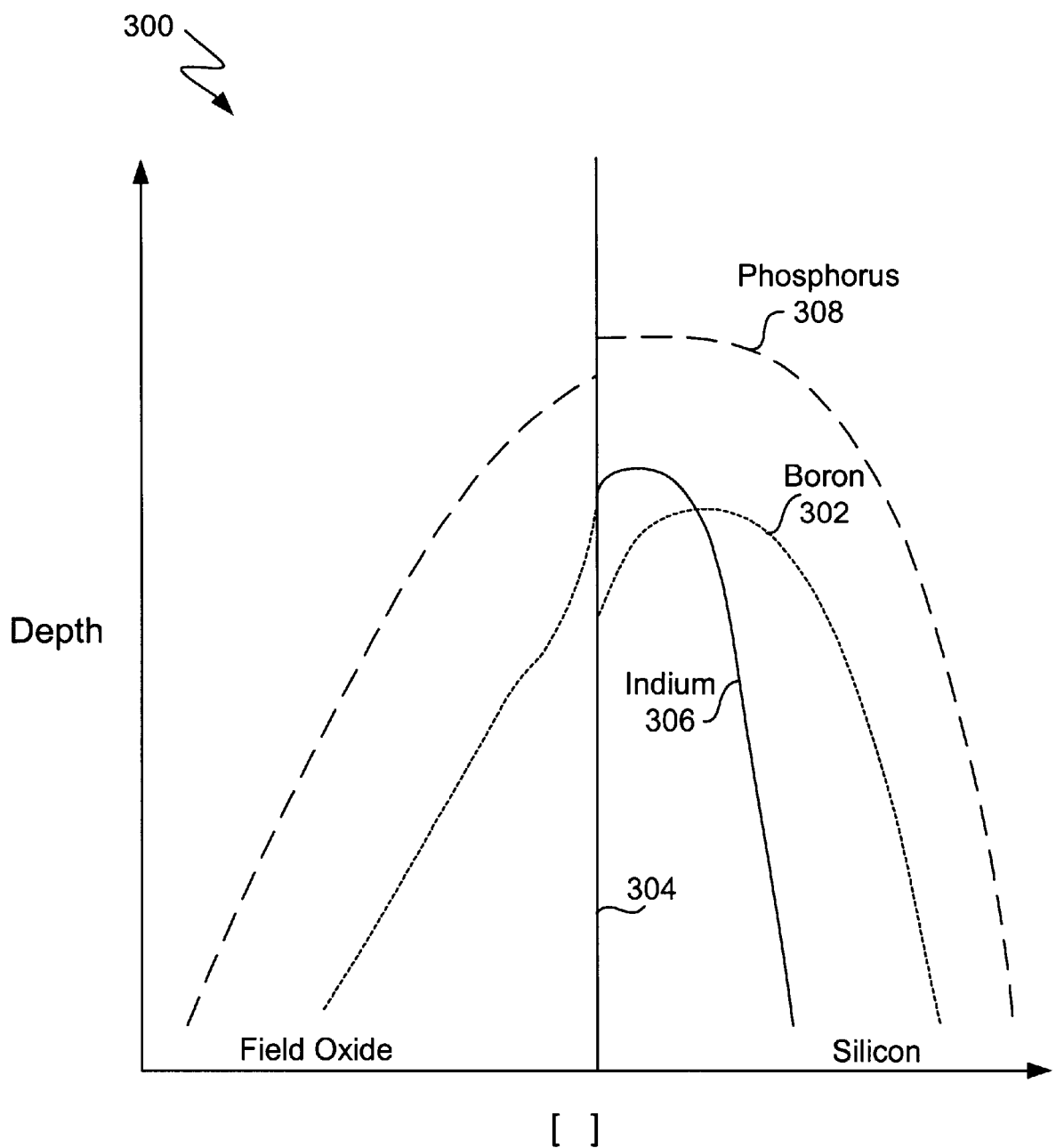
FIG. 3 depicts a graph showing the dopant profile (depth vs. dopant concentration) for cross-sections below and through the field isolation of a CMOS semiconductor device in accordance with the present invention. Represented are the profiles for the n-well (curve 308) and p-well (curves 302 and 306) for a device with non-compensated wells, and the n-well (curves 302, 306 and 308) and p-well (curves 302 and 306) for as device with compensated wells.

FIG. 3 depicts a graph showing the dopant profile (depth vs. dopant concentration) for cross-sections below and through the field for a CMOS device fabricated in accordance with the present invention, such as following the process illustrated in FIGS. 2A to 2F. This plot 300 may be compared with the plot 100 of FIG. 1 for an illustration of an important advantage conferred by the present invention. The various dopant concentrations (boron 302, indium 306, and phosphorus 308) are represented as a function of their concentration at the depth of the wafer 201, such as illustrated in FIG. 2F, starting from substantially the center of the STI 230 and moving from the oxide surface down to and through the silicon 200 at different lateral positions. In the case of a non-compensated well scheme curves 306 and 308 would present the doping conditions in the n-well region under the field oxide whereas 306 and 302 would present the p-well region under the field oxide. For a compensated well scheme 302, 306, and 308 would be present in the n-well region under the field oxide and 306 and 302 only in the p-well region under the field oxide. While boron 302 tends to deplete at the field isolation/silicon interface 304 due to its tendency to diffuse and segregate, as in conventional devices, the indium 306 implanted at the oxide/silicon interface exhibits only a limited mobility and is therefore present to maintain a high concentration of p-dopant at the interface 304. Therefore the p-doping is kept strong under the oxide and punchthrough is avoided.

Although the foregoing invention has been described in some detail for purposes of clarity of understanding, it will be apparent that certain changes and modifications may be practiced within the scope of the appended claims.

Accordingly, the present embodiments are to be considered as illustrative and not restrictive, and the invention is not to be limited to the details given herein, but may be modified within the scope and equivalents of the appended claims.

What is claimed is:

1. A process for forming a shallow trench isolation in a semiconductor device, comprising:
    depositing a pad oxide layer on the surface of a silicon substrate;
    forming a shallow trench in the substrate;
    forming an oxide liner in the shallow trench thereby creating a silicon/oxide interface in said trench;
    implanting indium into the trench; and
    filling the trench with oxide.

2. The process of claim 1, firther comprising forming and patterning a nitride mask layer on the pad oxide layer prior to forming the shallow trench.

3. The process of claim 1, wherein said trench is formed about 0.2 to 0.4 micron deep by etching.

4. The process of claim 1, wherein the trench is filled by a chemical vapor deposition technique selected from HDP-CVD and APCVD.

5. The process of claim 2, further comprising removing the mask and planarizing the semiconductor device down to the substrate.

6. The process of claim 5, further comprising implanting n-well and p-well dopants to form a CMOS device having n- and p-wells in the substrate.

7. The process of claim 6, wherein at least said n-well is a compensated well.

8. The process of claim 7, wherein said wells are non-compensated wells.

9. The process of claim 7, wherein said n-well is doped with phosphorus, boron and indium and said p-well is doped with boron and indium.

10. The process of claim 8, wherein said n-well is doped with phosphorus and indium and said p-well is doped with boron and indium.

11. The process of claim 1 wherein said indium implant is conducted with single or multiply charged indium ions.

12. The process of claim 11 wherein said indium implant is conducted 150 keV implant energy and 2.5e12 cm$^{-2}$ implant dose using singly charged indium ions.

13. The process of claim 1, wherein the indium implant is conducted such that a peak concentration of indium results substantially at or below the oxide interface of said silicon substrate.

14. The process of claim 11, wherein the indium implant is conducted such that a sufficient dose of indium is implanted at the oxide interface of said silicon to increase the total p-type doping at the silicon/oxide interface, but not to exceed the n-type doping at said interface.

* * * * *